(12) United States Patent
Ali et al.

(10) Patent No.: US 10,361,095 B2
(45) Date of Patent: *Jul. 23, 2019

(54) METAL INTERCONNECT PROCESSING FOR AN INTEGRATED CIRCUIT METAL STACK

(71) Applicant: TEXAS INSTRUMENTS INCORPORATED, Dallas, TX (US)

(72) Inventors: Abbas Ali, Plano, TX (US); Dhishan Kande, Dallas, TX (US); Qi-Zhong Hong, Richardson, TX (US); Young-Joon Park, Plano, TX (US); Kyle McPherson, Lucas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/981,725

(22) Filed: May 16, 2018

(65) Prior Publication Data

US 2019/0074193 A1 Mar. 7, 2019

Related U.S. Application Data

(63) Continuation of application No. 15/697,098, filed on Sep. 6, 2017, now Pat. No. 10,002,774.

(51) Int. Cl.
*H01L 21/768* (2006.01)
*H01L 21/3213* (2006.01)

(52) U.S. Cl.
CPC .. *H01L 21/32136* (2013.01); *H01L 21/76819* (2013.01); *H01L 21/76837* (2013.01); *H01L 21/76841* (2013.01)

(58) Field of Classification Search
None
See application file for complete search history.

(56) References Cited

U.S. PATENT DOCUMENTS

| 5,677,244 | A | 10/1997 | Venkatraman |
| 5,801,098 | A * | 9/1998 | Fiordalice ......... H01L 21/76838 257/E21.582 |
| 6,348,403 | B1 | 2/2002 | Raina et al. |
| 6,436,816 | B1 | 8/2002 | Lee |
| 10,002,774 | B1 * | 6/2018 | Ali ................... H01L 21/32136 |
| 2006/0192229 | A1 * | 8/2006 | Kato ....................... H01L 27/13 257/207 |
| 2010/0200991 | A1 | 8/2010 | Akolkar |

* cited by examiner

*Primary Examiner* — Thien F Tran
(74) *Attorney, Agent, or Firm* — Andrew R. Ralston; Charles A. Brill; Frank D. Cimino

(57) ABSTRACT

A method of fabricating an integrated circuit (IC) includes depositing an aluminum-containing metal interconnect layer at a first temperature over a semiconductor device having a plurality of transistors. The metal interconnect layer is annealed at a maximum annealing temperature that is less than the first temperature. The metal interconnect layer is patterned after the annealing, thereby interconnecting the transistors.

16 Claims, 5 Drawing Sheets

US 10,361,095 B2

METAL INTERCONNECT PROCESSING FOR AN INTEGRATED CIRCUIT METAL STACK

CROSS REFERENCE TO RELATED APPLICATIONS

Under 35 U.S.C. § 120, this continuation application claims the benefit of and priority to U.S. patent application Ser. No. 15/697,098, filed on Sep. 6, 2017, now issued as U.S. Pat. No. 10,002,774, the entirety of which are hereby incorporated herein by reference.

FIELD

Disclosed embodiments relate to metallization interconnect processing for semiconductor devices.

BACKGROUND

The electrical conductivity of aluminum (Al) is lower than that of copper (Cu). In the International System of Units, the electrical conductivity for aluminum is $3.5 \times 10^7$ S/m, whereas for copper, the electrical conductivity is $5.96 \times 10^7$ S/m. However Al-based interconnects for integrated circuits (ICs) are better suited to situations where low cost, ease of processing, and ability to support higher voltage are significant design considerations. Cu being a much heavier atom as compared to Al is far better than Al when it comes to electromigration (EM) resistance. 'Doping' Al with small amounts of Cu has shown to improve the EM resistance. Further enhancements in EM lifetime in Al-based interconnects can be achieved by depositing the films on a strong (111) crystal orientation using seed layers such as Ti/TiN under the Al or the Al—Cu layer.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include new metal interconnect processing for a non-reactive metal stack. As used herein a "non-reactive metal stack" refers to a metal interconnect stack where the interconnect layer comprising Al (e.g., Al—Cu or pure Al) is not deposited directly on top of a Ti layer and has a barrier layer (e.g., TiN) in between it and the Ti layer that minimizes the chemical reaction that would otherwise occur between Al—Cu/Al layer and the Ti layer. In contrast in a reactive metal stack the Al—Cu or Al layer is deposited directly on top of a Ti layer and a sintering process is used to react the Al and Ti layers at the interface. There can be a Ti layer directly on top of the interconnect layer comprising Al with an optional barrier layer in between. As long as the temperature is generally <300° C. during and after the Ti layer deposition the Ti layer can be directly deposited on the interconnect layer comprising Al and no reaction will occur, so this top side arrangement even without a barrier layer will still be a non-reactive metal stack.

Disclosed processing for an integrated circuit includes depositing an aluminum-containing metal interconnect layer, e.g. a non-reactive stack, at a first temperature over a semiconductor device having a plurality of transistors. The metal interconnect layer is annealed at a maximum annealing temperature that is less than the first temperature. The metal interconnect layer is patterned after the annealing, thereby interconnecting the transistors. Disclosed processing for a non-reactive metal interconnect stack has been found to provide good EM properties and a significantly improved yield.

A method of fabricating an integrated circuit (IC) includes depositing an aluminum-containing metal interconnect layer at a first temperature over a semiconductor device having a plurality of transistors. The metal interconnect layer is annealed at a maximum annealing temperature that is less than the first temperature. The metal interconnect layer is patterned after the annealing, thereby interconnecting the transistors

BRIEF DESCRIPTION OF THE DRAWINGS

Reference will now be made to the accompanying drawings, which are not necessarily drawn to scale, wherein.

DETAILED DESCRIPTION

Figure 1:
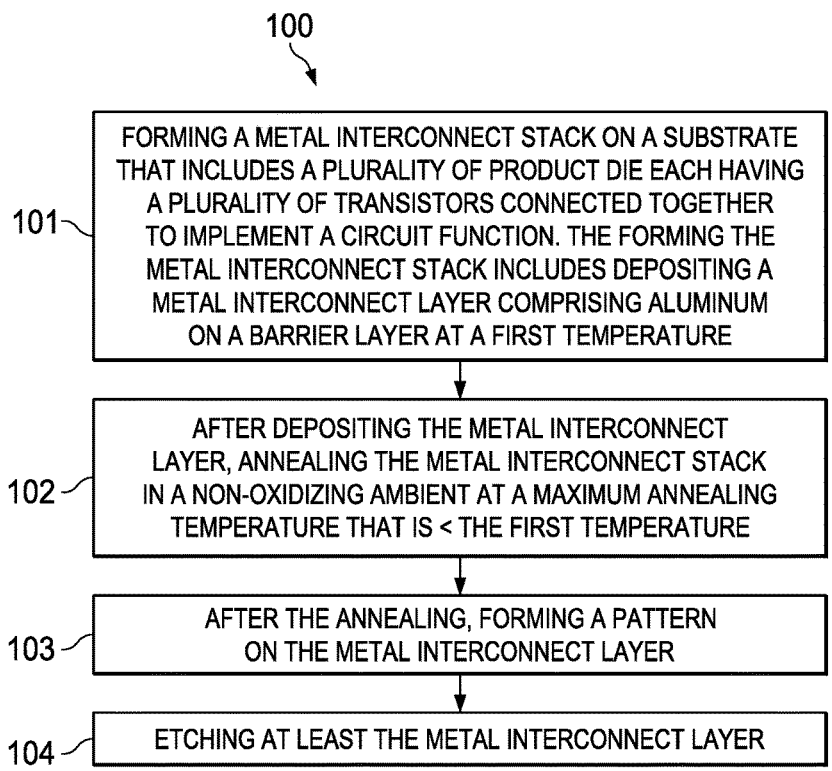
FIG. 1 is a flow chart that shows steps in an example method of fabricating an IC including disclosed metal interconnect processing for a non-reactive metal stack, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 of fabricating an IC including new metal interconnect processing for a non-reactive metal stack. Disclosed embodiments recognize for a non-reactive metal stack, no sintering is done post-metal interconnect layer deposition or post metal interconnect layer etch, and due to the presence of the barrier layer the reaction at the interface of the Al or Al—Cu/Al interconnect layer and the Ti/TiN layers is expected to be minimal. Disclosed embodiments also recognize conventional processing for a non-reactive metal stack with no annealing either before or after the metal interconnect patterning and etching results in poor electromigration (EM) lifetime performance. Disclosed embodiments moreover also recognize conventional annealing of the non-reactive stack post metal interconnect etch results in formation of side hillocks that can cause shorts between adjacent metal interconnect lines.

Step 101 comprises forming a metal interconnect stack on a substrate that includes a plurality of product IC die each having a plurality of transistors, as well as diodes, resistors, and capacitors, connected together to implement a circuit function. The substrate has at least a semiconductor surface and can comprise silicon, silicon-germanium, or other semiconductor material. One particular arrangement is a silicon epi layer on a bulk silicon material.

The forming the metal interconnect stack includes depositing a metal interconnect layer comprising aluminum at a first temperature on a barrier layer (TiN) that was deposited on a seed layer that is typically Ti. The metal interconnect layer can comprise pure Al, or Al—Cu which is known to have better EM properties as compared to Al. The thickness of the metal interconnect layer is generally 2 kA to 1 µm. The Al or Al—Cu film is typically deposited by a physical vapor deposition (PVD) sputtering process, generally a DC magnetron sputtering process. The first temperature is generally 330° C. to 400° C.

Step 102 comprises after depositing the metal interconnect layer, annealing the metal interconnect stack in a non-oxidizing ambient at a maximum annealing temperature that is less than the first temperature, such as 275° C. to 325° C. for the case of a 330° C. first temperature. Annealing above the deposition temperature generally results in vertical hillock formation, which in turn causes yield loss. The annealing at the maximum annealing temperature is generally for 30 to 90 minutes. This annealing can comprise a furnace anneal, or a hot plate anneal where the wafer surface temperature and the heat transfer mechanism to the metal interconnect layer is different. The non-oxidizing ambient comprises flowing only $N_2$ or only an inert gas, or only $N_2$ and an inert gas. If an inert gas is used it is typically argon or helium. However, any gas (or gas mixture) that does not react with the metal interconnect layer can generally be used. In one specific embodiment the annealing the metal interconnect stack is performed at a maximum annealing temperature that is at least 30° C.<the metal interconnect layer deposition temperature and is in a temperature range from 275° C. to 325° C. for 30 to 90 minutes. An anti-reflective coating (ARC) layer can be deposited on the metal interconnect layer before or after the step 102 annealing.

Step 103 comprises after the annealing, forming a pattern on the metal interconnect layer. The pattern generally comprises a photoresist pattern. Step 104 comprises etching at least the metal interconnect layer. Typically a reactive ion etch (RIE) is used. $Cl_2/BCl_3$ chemistry can be used for etching an Al—Cu interconnect layer. An advantage of annealing prior to step 103 (and thus before etching) is that it prevents formation of side hillocks in the metal interconnect comprising Al.

The metal interconnect layer can be between a top layer stack of TiN on Ti and a bottom layer stack of the barrier layer comprising TiN on Ti. See the example non-reactive metal interconnect stack shown in FIG. 2 having the metal interconnect layer in between a top layer stack and a bottom layer stack described below. In this embodiment the etching can comprise a single etch that etches the top layer stack, the metal interconnect layer, and the bottom layer stack, typically using RIE.

After this etching a gap filling layer can be deposited, such as by depositing a high density plasma CVD (HDP-CVD) silicon oxide layer for gap filling between the metal interconnect layer lines at a temperature less than the first temperature, such as 300° C. to 399° C. The HDP-CVD silicon oxide layer deposition can be followed by an additional oxide CVD deposition, and then chemical mechanical polish (CMP) can be used to smooth out the surface over the metal interconnect layer.

Figure 2:
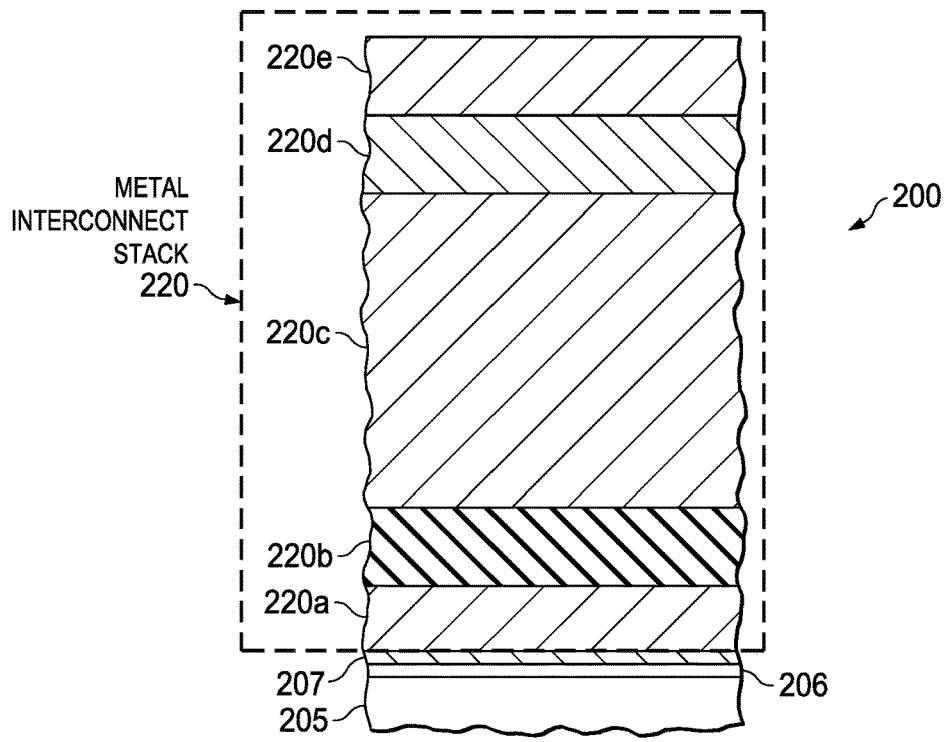
FIG. 2 is a cross sectional depiction of a portion of an IC die of an in-process wafer showing an example non-reactive metal interconnect stack on a multi-level metal interconnect stack on a substrate having a device layer which can benefit from disclosed metal interconnect processing.

FIG. 2 is a cross sectional depiction of a portion of an IC die 200 of in-process wafer showing an example non-reactive metal interconnect stack (metal interconnect stack) 220 on a multi-level metal interconnect stack 207 on a substrate 205 having a device layer 206 formed on a top surface that includes interconnected transistors, diodes, resistors, and capacitors which can benefit from disclosed level metal interconnect processing. The metal interconnect stack 220 includes the top metal interconnect layer 220c generally being an Al or Al—Cu layer in between a top layer stack comprising a TiN layer 220e generally in a thickness range from 200 to 500 Angstroms on a Ti layer 220d generally in a thickness range from zero (thus not present) to 200 Angstroms, and a bottom layer stack comprising a TiN layer 220b generally in a thickness range from 50 to 500 Angstroms on a Ti layer 220a generally in a thickness range from 50 to 500 Angstroms.

Figure 3A:
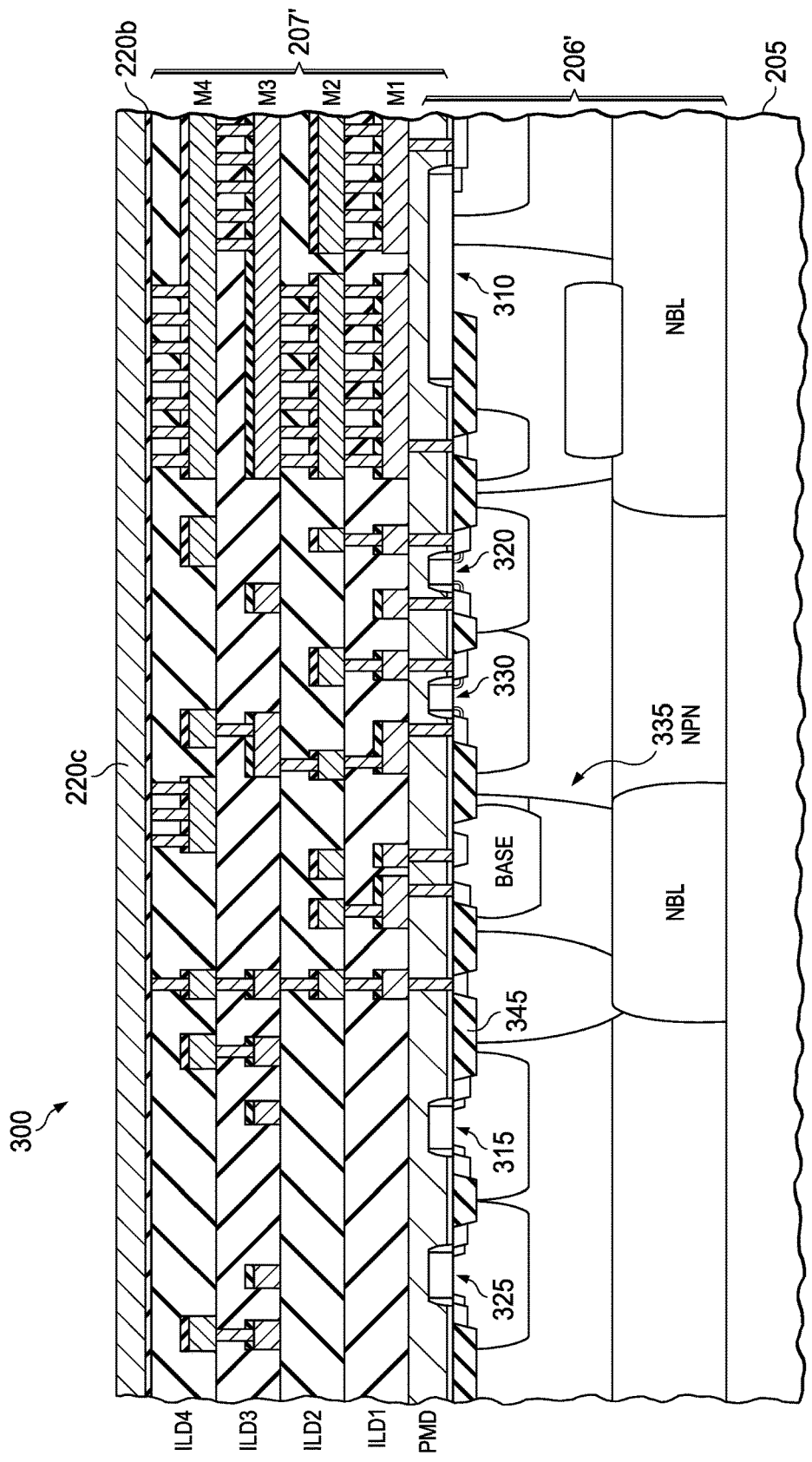
FIGS. 3A-3D are cross-sectional diagrams showing process progression for an example method of forming an IC showing disclosed metal interconnect processing for forming a non-reactive metal stack for a top level metal interconnect, according to an example embodiment.

FIGS. 3A-3D are cross-sectional diagrams showing process progression for an example method of forming an IC showing disclosed metal interconnect processing for forming a non-reactive metal stack for a top level metal interconnect, according to an example embodiment. FIG. 3A shows a cross sectional view of a top metal interconnect layer 220c on a barrier layer 220b after Al or Al—Cu deposition (corresponding to step 101 in method 100) on an IC 300 comprising a substrate 205 having a device layer 206' and a multi-level metal interconnect stack 207' thereon. Although not shown in FIGS. 3A-3D, there can be a Ti layer beneath the barrier layer 220b (shown as Ti layer 220a in FIG. 2) and a TiN layer (shown as a TiN layer 220e in FIG. 2) on an optional Ti layer (shown as a Ti layer 220d in FIG. 2) on the top metal interconnect layer 220c.

The multi-level metal interconnect stack 207' is shown comprising 4 lower patterned metal interconnect levels shown as M4, M3, M2 and M1 and dielectric layers comprising a bottom pre-metal dielectric (PMD) layer, and ILD1, ILD2, ILD3 and ILD 4 separating the various metal layers with filled vias through the PMD and ILD layers for connecting between the respective metal layers. The device layer 206' is shown having a Laterally Diffused MOSFET (LDMOS) device 310, a first PMOS device 315 and second PMOS device 320, first NMOS device 325 and second NMOS device 330, and a vertical NPN bipolar device 335. These transistors, other transistors and other circuitry (not shown) are connected together on the IC 300 to implement a circuit function. Shallow trench isolation (STI) 345 is shown at the top surface of the substrate 205.

Figure 3B:
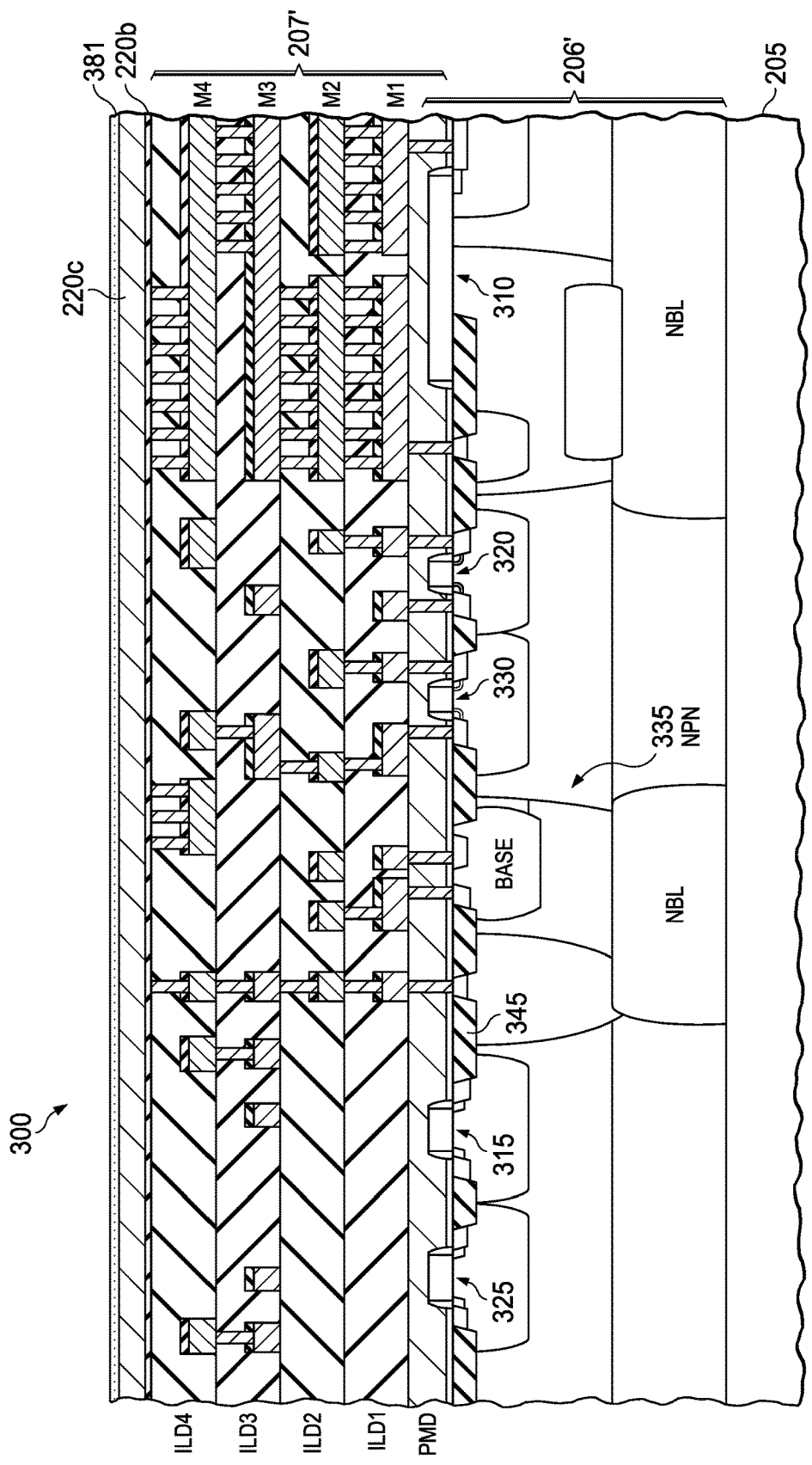

FIG. 3B shows a cross sectional view of the IC die 300 after deposition of an ARC layer 381 on the top metal interconnect layer 220c, such as comprising a SiON layer. The ARC layer 381 as known in the art of lithography eliminates the swing effect and standing waves in photoresist. A top metal interconnect layer anneal (corresponding to step 102 in method 100) follows the ARC layer deposition. As described above, step 102 comprises annealing the metal interconnect stack in a non-oxidizing ambient at a maximum annealing temperature that is < the temperature that the metal interconnect layer comprising aluminum was depositing at.

Figure 3C:
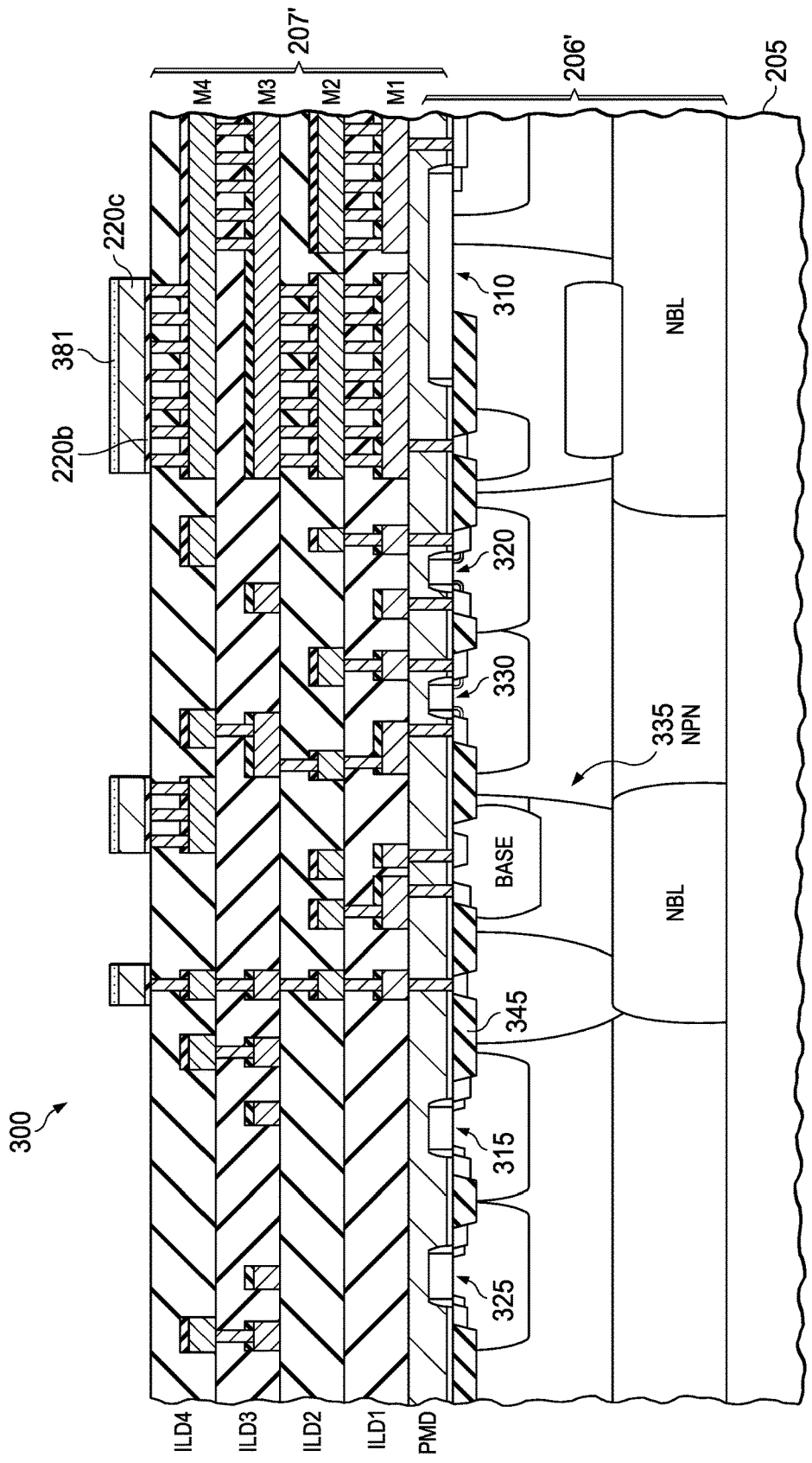

FIG. 3C shows a cross sectional view of the IC 300 after patterning and etching the top metal interconnect layer 220c.

Patterning corresponds to step 103 in method 100 which comprises after annealing the metal interconnect stack forming a pattern on the metal interconnect layer, and etching the metal interconnect layer corresponds to step 104 in method 100. As described above, the etching can comprise RIE.

Figure 3D:
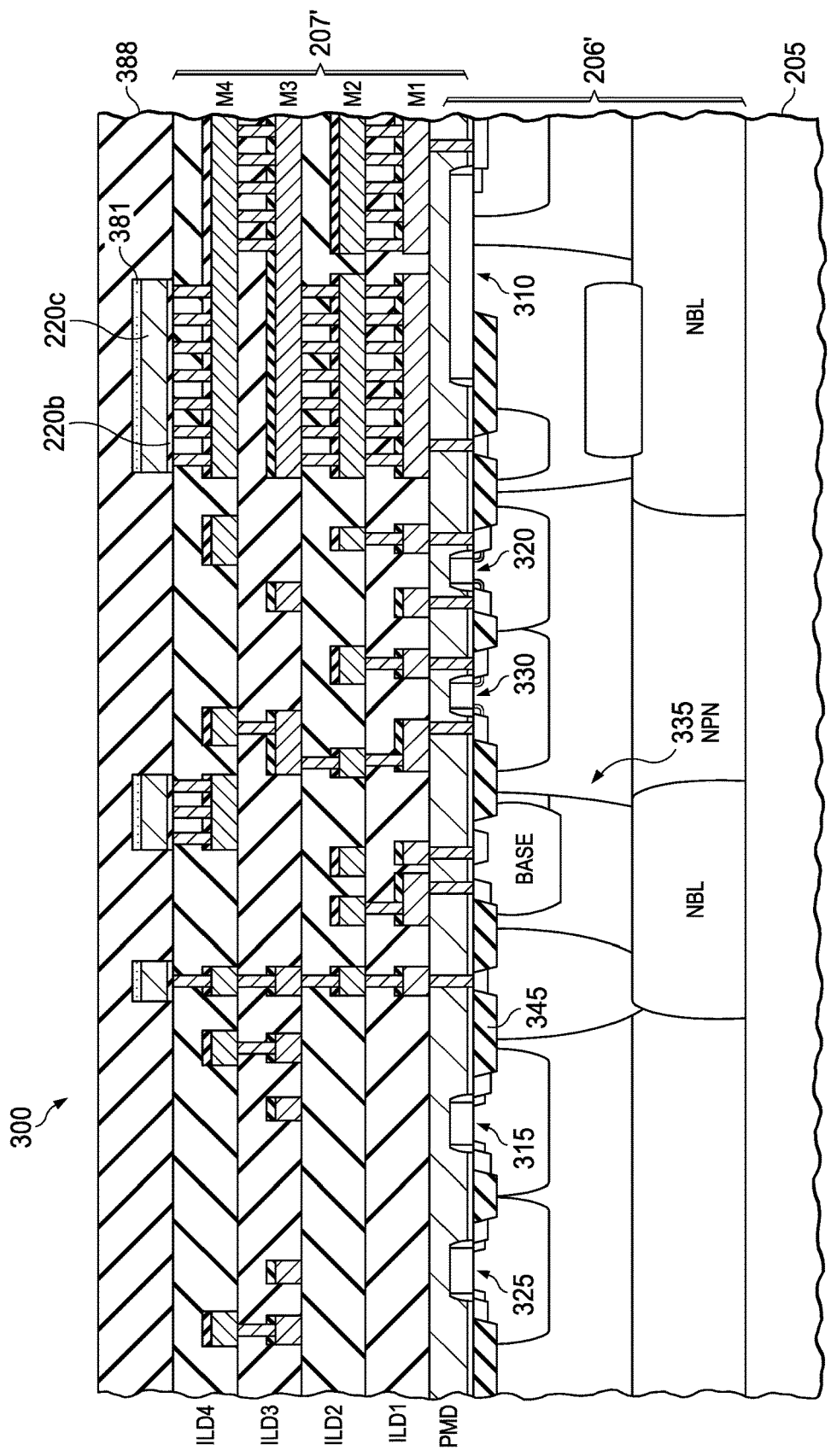

FIG. 3D shows a cross sectional view of the IC 300 after a CVD deposition that generally deposits a silicon oxide layer 388 for gap filling between the top metal interconnect lines. The CVD oxide deposition is generally followed by CMP. The CVD oxide deposition can comprise high density plasma CVD (HDP-CVD). HDP-CVD systems form a silicon oxide layer using a plasma that is approximately two orders of magnitude or greater than the plasma density of a standard, capacitively-coupled plasma CVD system which enables the plasma during deposition reaching even the deepest portions of closely spaced gaps, providing a layer with improved gap-fill capabilities as compared to films deposited in a low density plasma CVD system.

EXAMPLES

Disclosed embodiments are further illustrated by the following specific Examples, which should not be construed as limiting the scope or content of this Disclosure in any way.

Silicon wafers with patterned interconnect metal comb test structures were formed providing a non-reactive interconnect stack that are based on the IC die 200 shown in FIG. 2 that were electrically tested for shorts between the metal interconnect lines. The breakdown voltage between closely spaced (<0.25 μm line spacing) metal interconnect lines of an interdigitated comb structure was used as a proxy for yield. Disclosed metal interconnect layer processing comprised in sequence a 200° C. Ti 200 Angstrom sputter deposition, a room temperature (RT) TiN 275 Angstrom sputter deposition, a 350° C. Al—Cu sputter deposition of 0.45 μm, a RT Ti 50 Angstrom sputter deposition, a TiN 300 A sputter deposition, and a 300° C. 30 min $N_2$ only furnace anneal. After the furnace anneal, the processing comprised metal patterning, RIE etching the metal stack, HDP oxide deposition, and then CMP. Controls having the same metal comb test structure and the same interconnect stack had the same process flow except they had a 300° C. Al—Cu sputter deposition and a 300° C. 30 minute $N_2$ only furnace anneal, which were also electrically tested using the same metal comb test structures for shorts between the metal interconnect lines. The yield improvement from reduced shorts between the metal interconnect lines for disclosed metal interconnect layer processing was found to be at least 15% higher in percentage yield using the measured breakdown voltage as a proxy for yield.

Although a non-reactive metal interconnect stack generally eliminates the challenges for a reactive metal interconnect stack related to dimples or surface voids formed when the sinter-induced reaction between the Al/Al—Cu interconnect layer and Ti layers results in volume change that leads to loss of electrical connection or reliability problems, the lack of a thermal treatment leads to a highly stressed film, and this can cause stress voids in the film and EM failures. In order to relax the stresses, an annealing step is used. However, as evidenced by the controls in this example, conventional annealing at or above the Al/Al—Cu metal interconnect deposition temperature causes hillock formation as evidenced by the relatively high level of metal interconnect lines shorts detected. For disclosed metal interconnect layer processing, by raising the Al/Al—Cu deposition temperature from 300° C. to 350° C. (here in this example 350° C.) so that the metal interconnect deposition temperature is at or above the annealing temperature (here in this example 300° C.), this combination of a higher deposition temperature and a lower than deposition temperature anneal provides a metal interconnect stack that is robust to EM, and at the same time does not cause hillock formation and helps achieve high yield as evidenced by the reduced shorts between the metal interconnect lines in the comb test structures as compared to the controls in this electrical test.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating an integrated circuit (IC), comprising:
    depositing an aluminum-containing metal interconnect layer at a first temperature over a semiconductor device having a plurality of transistors;
    annealing said metal interconnect layer at a maximum annealing temperature that is less than said first temperature; and
    patterning said metal interconnect layer after said annealing, thereby interconnecting said transistors.

2. The method of claim 1, further comprising performing said annealing in a non-oxidizing ambient.

3. The method of claim 1, further comprising maintaining said annealing temperature for a period in a range between about 30 minutes and about 90 minutes.

4. The method of claim 1, wherein said first temperature is in a range between about 330° C. and about 400° C., and wherein said maximum annealing temperature is in a range between about 275° C. and about 325° C.

5. The method of claim 1, wherein said non-oxidizing ambient comprises $N_2$ or an inert gas.

6. The method of claim 1, wherein said metal interconnect layer is deposited onto a barrier layer.

7. The method of claim 6, wherein said barrier layer comprises TiN on Ti.

8. The method of claim 1, further comprising depositing a barrier layer directly on said metal interconnect layer prior to said annealing.

9. The method of claim 1, further comprising after said patterning depositing a high density plasma CVD (HDP-CVD) silicon oxide layer over said metal interconnect layer.

10. The method of claim 1, wherein a thickness of said metal interconnect layer is in a range between about 200 nm and about 1 μm.

11. The method of claim 1, wherein said metal interconnect layer is a top metal interconnect layer.

12. The method of claim 1, wherein said maximum annealing temperature is at least 30° C. less than said deposition temperature.

13. The method of claim 1, wherein said metal interconnect layer is formed over a barrier layer, and further comprising etching said metal interconnect layer and said barrier layer in a single etch process.

14. The method of claim 1, wherein said metal interconnect layer comprises Al—Cu.

15. The method of claim 1, wherein said metal interconnect layer is formed by a physical vapor deposition (PVD) process.

16. The method of claim 1, wherein said etching comprises reactive ion etching (RIE).

* * * * *